(12) United States Patent
Park

(10) Patent No.: US 7,851,295 B2
(45) Date of Patent: Dec. 14, 2010

(54) FLASH MEMORY DEVICE AND METHOD OF MANUFACTURING THE SAME

(75) Inventor: Jin Ha Park, Echeon-si (KR)

(73) Assignee: Dongbu Hitech Co., Ltd., Seoul (KR)

( * ) Notice: Subject to any disclaimer, the term of this patent is extended or adjusted under 35 U.S.C. 154(b) by 324 days.

(21) Appl. No.: 11/930,624

(22) Filed: Oct. 31, 2007

(65) Prior Publication Data

US 2008/0157165 A1 Jul. 3, 2008

(30) Foreign Application Priority Data

Dec. 27, 2006 (KR) .................. 10-2006-0135766

(51) Int. Cl.
*H01L 21/8238* (2006.01)
*H01L 29/788* (2006.01)

(52) U.S. Cl. ........................ 438/211; 257/315

(58) Field of Classification Search ............... 438/211, 438/230, 257, 266; 257/314–319, E29.135–E29.14
See application file for complete search history.

(56) References Cited

U.S. PATENT DOCUMENTS

2006/0163678 A1* 7/2006 Anezaki .................. 257/411

FOREIGN PATENT DOCUMENTS

KR 10-1996-0017473 2/1999

* cited by examiner

*Primary Examiner*—Calvin Lee
(74) *Attorney, Agent, or Firm*—Saliwanchik, Lloyd & Saliwanchik

(57) ABSTRACT

A flash memory device and a method of manufacturing a flash memory device are provided. The flash memory device includes a gate region on a semiconductor substrate, spacers on sidewalls of the gate region, and a passivation layer between the semiconductor substrate and a portion of each spacer.

8 Claims, 5 Drawing Sheets

FLASH MEMORY DEVICE AND METHOD OF MANUFACTURING THE SAME

CROSS-REFERENCE TO RELATED APPLICATION

The present application claims the benefit under 35 U.S.C. §119 of Korean Patent Application No. 10-2006-0135766, filed Dec. 27, 2006, which is hereby incorporated by reference in its entirety.

BACKGROUND

A flash memory device is a kind of programmable read only memory (PROM) capable of writing, erasing, and reading information.

Flash memory devices can be classified as NOR type and NAND type, according to their cell array structure. NOR type flash memory devices have cells disposed in parallel between a bit line and a ground, and NAND type flash memory devices have cells disposed in series between a bit line and a ground.

The NOR type flash memory device enables high-speed random access when performing reading operations, so it is typically used for booting mobile phones. The NAND type flash memory device has a slow reading speed and a rapid writing speed, so it is suitable to store data and is favorable for miniaturization.

Flash memory devices can be further classified into stack gate type and split gate type, according to the structure of a unit cell. Flash memory devices can be classified even further as floating gate devices and silicon-oxide-nitride-oxide-silicon (SONOS) devices, according to the type of charge storage layer. A floating gate device typically includes a floating gate of polycrystal silicon surrounded by an insulator. Charges are often injected into or emitted from a floating gate by channel hot carrier injection or Fowler-Nordheim tunneling (F-N tunneling), so that data can be stored or erased.

FIG. 1 shows the layout of a cell array in a related art flash memory device.

Referring to FIG. 1, a plurality of word lines 1 and a plurality of bit lines 3 intersecting the word lines 1 are disposed on the device. Cell devices (not shown) are disposed at the intersections of the word lines 1 and the bit lines 3. Contact plugs 5, which are electrically connected to the bit lines 3, are disposed between adjacent first and second cell devices. The adjacent first and second cell devices are electrically connected to one contact plug 5.

Corresponding cell devices are typically selected by the word lines 1, and data signals supplied to the bit lines 3 are generally stored in the selected cell devices through the contact plugs 5. Data signals stored in the selected cell devices can also be supplied to the bit lines 3 through the contact plugs 5.

FIG. 2 is a cross-sectional view taken along line I-I' of the cell array of FIG. 1.

Referring to FIG. 2, a unit cell can be defined by the first and second cell devices 26 and 28.

In order to partition the cell devices on a semiconductor substrate 11, shallow trench isolations (STIs) 13 are formed.

The first and second cell devices 26 and 28 are disposed between the adjacent STIs 13.

A gate oxide layer 15, a floating gate 16, an oxide-nitride-oxide (ONO) layer 17, and a control gate 18 are sequentially formed on the semiconductor substrate 11.

In order to isolate and protect a gate region, spacers 21 are formed on sidewalls of the gate oxide layer 15, floating gate 16, ONO layer 17, and control gate 18. The spacers 21 may include a first tetraethyl orthosilicate (TEOS) layer 21a, a silicon nitride (SiN) layer 21b, and a second TEOS layer 21c.

Source and drain regions 23 can be formed in the semiconductor substrate 11 adjacent to the spacers 21.

Thus, the first and second cell devices 26 and 28 can be defined by the source and drain regions 23, the spacers 21, and the gate region including the gate oxide layer 15, floating gate 16, ONO layer 17, and control gate 18.

In order to facilitate electrical contact with an external interconnection that may be present, silicide layers (not shown) can be formed on the control gate 18, as well as on the source and drain regions 23.

Before the silicide layers are formed, a cleaning process is typically performed on the control gate 18 and the source and drain regions 23 to remove any foreign materials from them that may be present.

However, when the cleaning process is performed, the first and second TEOS layers 21a and 21c of each spacer 21 often react with a cleaning solution, and thus are removed in part.

Specifically, an undercut phenomenon, in which portions of the first TEOS layer 21a of each spacer 21 is removed, often occurs.

This undercut phenomenon may occur to a great depth, such that the undercut parts beginning near a top surface of the spacer 21 and a bottom side surface of the spacer 21 of the first TEOS layers 21a of the adjacent spacers 21 are connected to each other.

Accordingly, when the contact plugs are formed, a conductive material for the contact plugs can infiltrate into the undercut parts. As a result, the adjacent contact plugs can be electrically interconnected through the conductive material infiltrated into the undercut parts, leading to a bit failure caused by a defective bridge between the cell devices.

Thus, there exists a need in the art for an improved flash memory device and fabricating method thereof.

BRIEF SUMMARY

Embodiments of the present invention provide a flash memory device and a manufacturing method thereof, in which an oxide layer can be formed on spacers to inhibit a bit failure.

In an embodiment, a flash memory device can include a gate region on a semiconductor substrate, spacers on sidewalls of the gate region, and a passivation layer between the semiconductor substrate and at least a portion of each spacer.

A method of manufacturing a flash memory device can include: forming a gate region on a semiconductor substrate; forming a first tetraethyl orthosilicate (TEOS) layer on sidewalls of the gate region; forming an oxide layer on the semiconductor substrate; forming a silicon nitride (SiN) layer on the semiconductor substrate; and patterning the oxide layer and the SiN layer to form a passivation layer and a SiN layer spacer.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
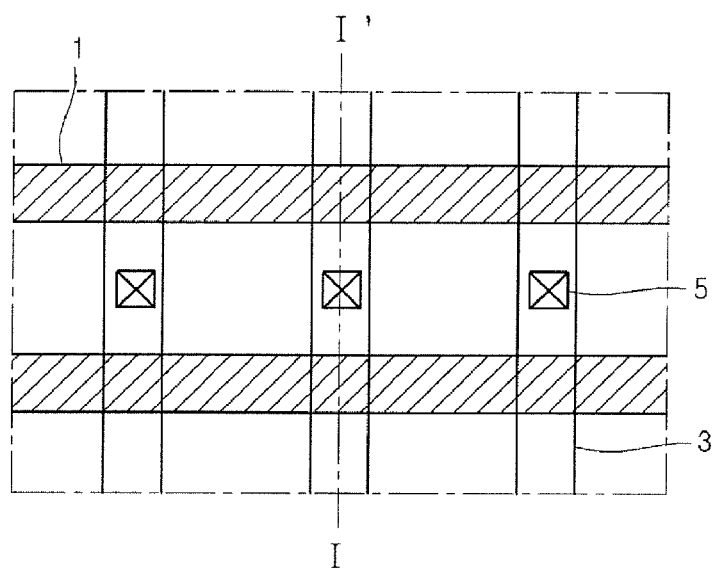
FIG. 1 shows the layout of a cell array in a related art flash memory device.
Figure 2:
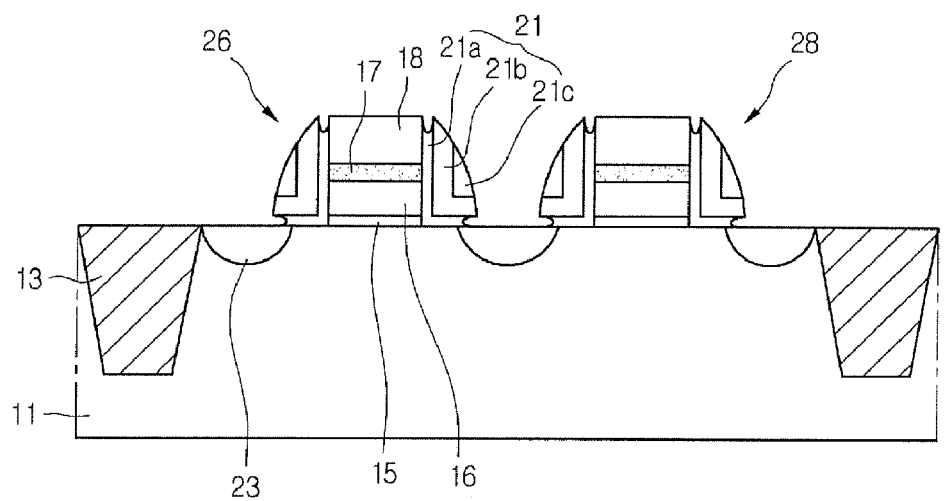
FIG. 2 is a cross-sectional view taken along line I-I' of the cell array of FIG. 1.
Figure 3:
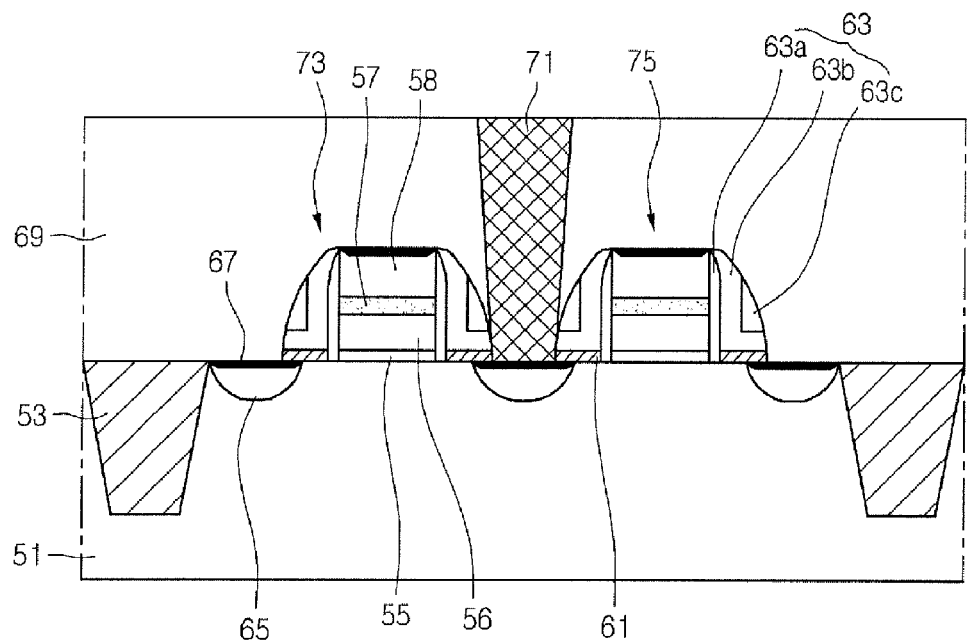
FIG. 3 is a cross-sectional view showing a flash memory device according to an embodiment of the present invention.

FIG. 3 is a sectional view illustrating a flash memory device according to a first embodiment.

Referring to FIG. 3, shallow trench isolations (STIs) 53 can be disposed in a semiconductor substrate 51 to partition unit cell devices.

In an embodiment, each unit cell device can include a first cell device 73 and a second cell device 75. Thus, no STI 53 is formed between the first and second cell devices 73 and 75. The first and second cell devices 73 and 75 can be formed between adjacent STIs 53.

Each cell region can include a gate region comprising a gate oxide layer 55, a floating gate 56, an oxide-nitride-oxide (ONO) layer 57, and a control gate 58. A first cell region can be provided for forming the first cell device 73, and a second cell region can be provided for forming the second cell device 75.

A passivation layer 61 can be disposed on the semiconductor substrate 51 adjacent to the gate region.

Spacers 63 can be disposed on the sidewalls of the gate oxide layer 55, floating gate 56, ONO layer 57, and control gate 58. The spacers 63 can be disposed such that they are at least partially on the passivation layer 61. The spacers 63 function to isolate and protect a gate region. Each spacer 63 can include a first tetraethyl orthosilicate (TEOS) layer 63a and a silicon nitride (SiN) layer 63b. In an embodiment, a second TEOS layer 63c can also be included in each spacer 63.

The first TEOS layer 63a can be covered by the SiN layer 63b and passivation layer 61 such that it is not exposed. The SiN layer 63b can be disposed such that it is in direct contact with the passivation layer 61.

The thickness of the passivation layer 61 can be from about 10 Å to about 20 Å.

Source and drain regions 65 can be formed in the semiconductor substrate 51 adjacent to the spacers 63. The source and drain regions 65 are regions having conductivity.

In an embodiment, silicide layers 67 can be disposed on the control gate 58 and on the source and drain regions 65. The silicide layers 67 can improve electrical contact performance among the gate region, the source and drain regions 65, and any interconnection that may be formed in the device.

Thus, the first and second cell devices 73 and 75 can be defined by the source and drain regions 65, the spacers 63, and the gate region, including the gate oxide layer 55, floating gate 56, ONO layer 57, and control gate 58.

An interlayer dielectric layer 69 can be disposed on the semiconductor substrate 51 using a dielectric material. The dielectric material can be any appropriate material known in the art, for example, boron phosphor silicate glass (BPSG) or undoped silicate glass (USG).

The interlayer dielectric layer 69 can include a via hole (not shown) to expose the silicide layer 67 on the drain region in the semiconductor substrate 51 between the first and second cell devices 73 and 75.

A contact plug 71 that can be electrically connected with the silicide layer 67 on the drain region can be disposed in the via hole.

As described above, the first TEOS layer 63a of each spacer 63 is covered by the passivation layer 61 and SiN layer 63b, and thus is not exposed. If a cleaning process is performed in order to form the silicide layers 67, the first TEOS layer 63a of each spacer 63 can be inhibited from coming into contact with a cleaning solution, thus inhibiting the TEOS layer 63a from being removed. As a result, no undercut occurs at the first TEOS layer 63a, and a bit failure that is typically caused by a defective bridge between cell devices can be inhibited.

FIGS. 4A through 4F are cross-sectional views illustrating a method of manufacturing a flash memory device according to an embodiment of the present invention.

Figure 4A:
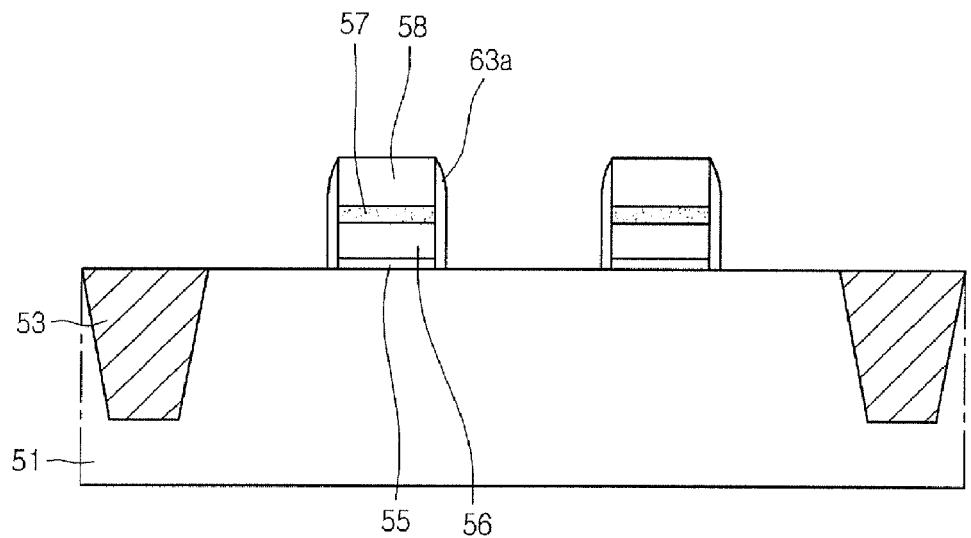
FIGS. 4A through 4F are cross-sectional views illustrating a method of manufacturing a flash memory device according to an embodiment of the present invention.

Referring to FIG. 4A, STIs 53 can be formed on a semiconductor substrate 51 to partition unit cell devices. The STIs 53 can be formed using a silicon oxide layer, a BPSG layer, or any other suitable material known in the art.

Each unit cell device can include a first cell device 73 and a second cell device 75 (as shown in FIG. 3). Thus, no STI 53 would be formed between the first and second cell devices 73 and 75, and the first and second cell devices 73 and 75 can be formed between adjacent STIs 53.

A gate oxide layer 55 can be formed on the semiconductor substrate, and a first polysilicon layer can be formed on the gate oxide layer 55. An ONO layer 57 can be formed on the first polysilicon layer, and a second polysilicon layer can be formed on the ONO layer.

The gate oxide layer 55, first polysilicon layer, ONO layer 57, and second polysilicon layer can be selectively patterned to form the gate oxide layer 55, a floating gate 56, the ONO layer 57, and a control gate 58 in each cell region. The first cell device 73 can be formed in the first cell region, and the second cell device 75 can be formed in the second cell region.

A first TEOS layer 63a can be formed and patterned on the semiconductor substrate 51, such that the first TEOS layer 63a is formed on sidewalls of the gate oxide layer 55, floating gate 56, ONO layer 57, and control gate 58.

The first TEOS layer 63a can be formed using, for example, reactive ion etching (RIE).

Figure 4B:
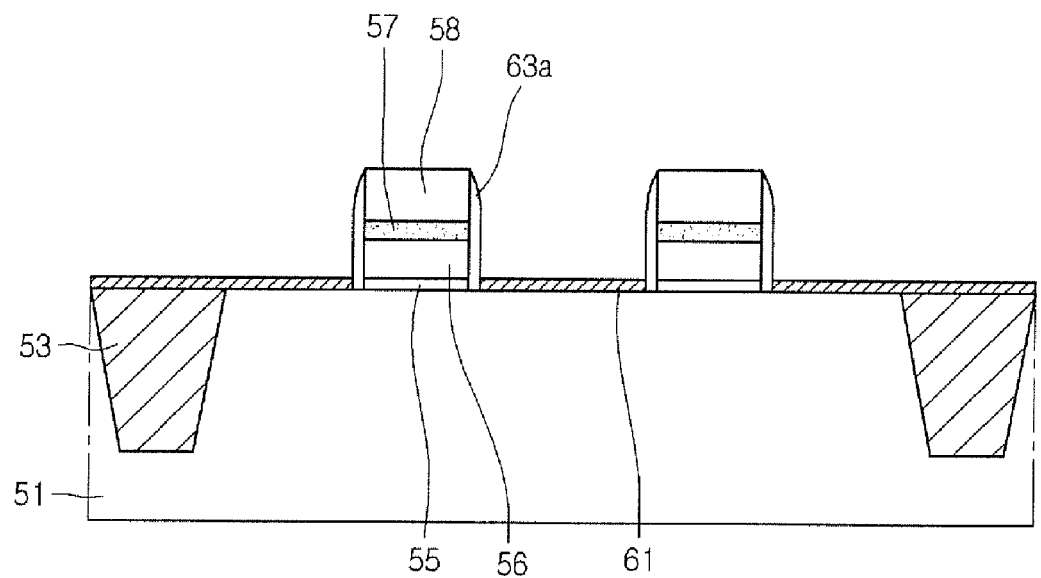

Referring to FIG. 4B, the semiconductor substrate 51 can be subjected to thermal oxidation to form an oxide layer on the semiconductor substrate 51. The thermal oxidation process can be, for example, rapid thermal processing (RTP), and can form the oxide layer to a thickness of about 10 Å to about 20 Å. The RTP can be performed at a temperature of about 800° C. to about 900° C.

Figure 4C:
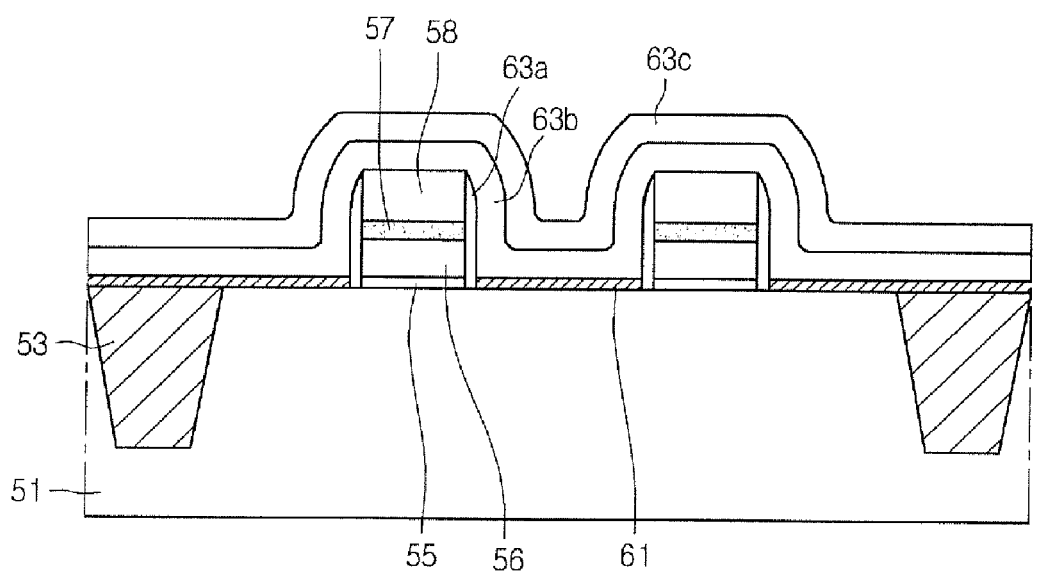

Referring to FIG. 4C, a SiN layer 63b. can be formed on the semiconductor substrate 51. In an embodiment, a second TEOS layer 63c can also be formed on the SiN layer 63b.

Figure 4D:
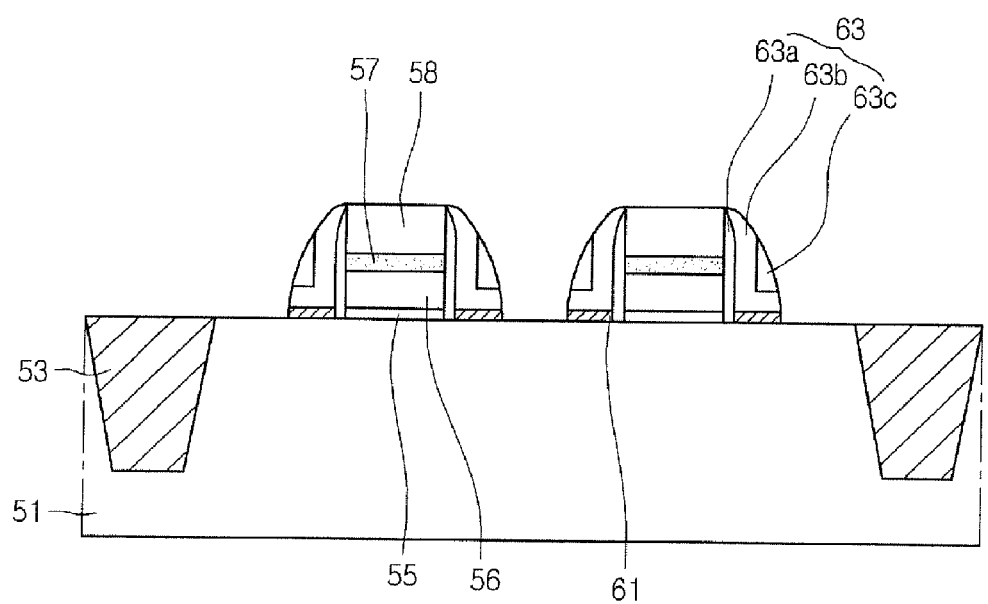

Then, referring to FIG. 4D, the oxide layer and SiN layer 63b (and second TEOS layer 63c, if present) can be patterned to form a passivation layer 61 and the SiN layer spacer 63b (and the second TEOS layer spacer 63c). The SiN layer 63b (and second TEOS layer 63c, if present) can be formed on the sidewall of each first TEOS layer 63a, and the passivation layer 61 can remain on the semiconductor substrate 51 under the SiN layer 63b. The passivation layer 61 can be patterned together with the SiN layer 63a to have approximately the same width along the semiconductor substrate 51 as the SiN layer 63a. Accordingly, the first TEOS layer 63a can be covered from exposure to the outside by the passivation layer 61 and the SiN layer spacer 63b.

Each spacer 63 can be formed by the first TEOS layer 63a and SiN layer 63b (and second TEOS layer 63c, if present).

Each spacer 63 can function to isolate and protect a gate region, and each spacer 63 can be formed on the sidewalls of the gate oxide layer 55, floating gate 56, ONO layer 57, and control gate 58.

Figure 4E:
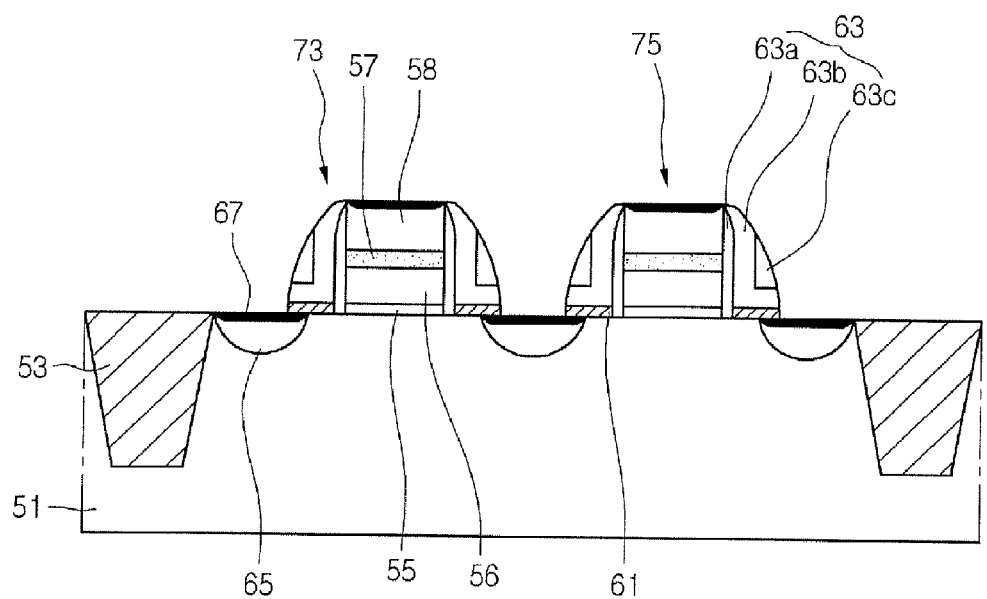

Referring to FIG. 4E, an ion implantation process can be performed, using the spacers 63 and the control gates 58 as a mask, to form source and drain regions 65 in the semiconductor substrate 51 adjacent to the spacers 63. The source and drain regions 65 can be implanted with ions by the ion implantation process and can thus have conductivity.

The control gates 58 and the source and drain regions 65 can be cleaned using a cleaning process.

Here, a cleaning solution that may be used for the cleaning process does not come into contact with the first TEOS layer 63a of each spacer 63, so that no undercut occurs at the first TEOS layer 63a.

A conductive material can be formed on an entire region of the semiconductor substrate 51 to form silicide layers 67 on the control gates 58 and the source and drain regions 65. The conductive material can be any suitable material known in the art, for example, cobalt (Co). The silicide layers 67 can be formed to improve electrical contact performance in the gate region, the source and drain regions 65, and any interconnection that may be formed in the device.

Thus, the first and second cell devices 73 and 75 can be defined by the source and drain regions 65, the spacers 63, and the gate region including the gate oxide layer 55, floating gate 56, ONO layer 57, and control gate 58.

Figure 4F:
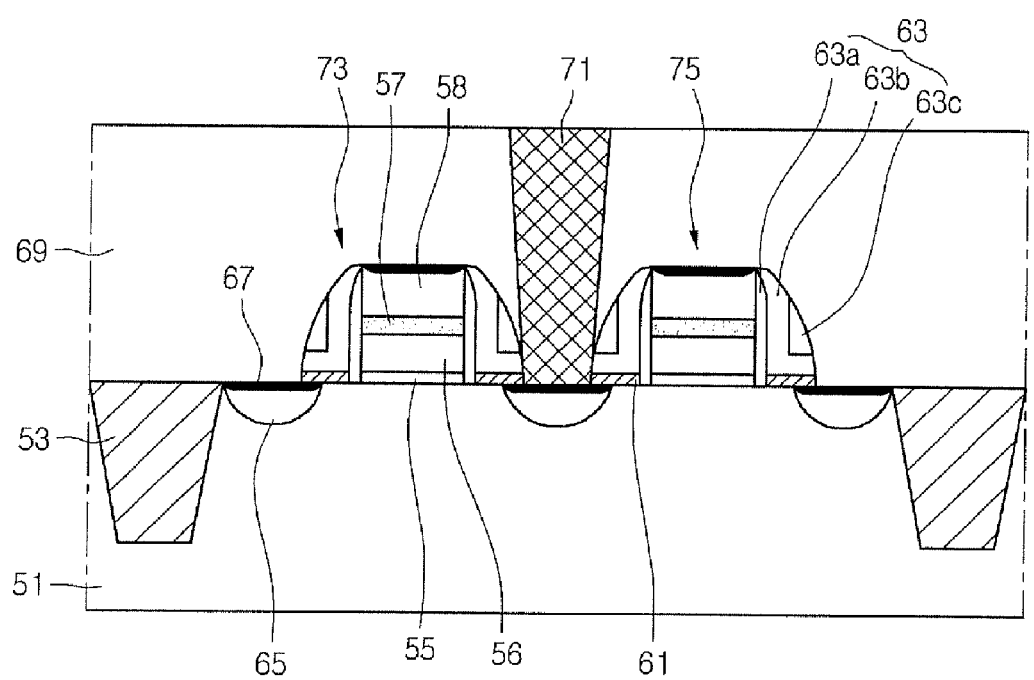

Referring to FIG. 4F, an interlayer dielectric layer 69 can be formed on the semiconductor substrate 51 including the first and second cell devices 73 and 75. The interlayer dielectric layer 69 can be formed using any suitable dielectric material known in the art, for example, BPSG or USG.

Then, the interlayer dielectric layer 69 can be selectively patterned to form a via hole (not shown) exposing the silicide layer 67 on the drain region formed in the semiconductor substrate 51 between the first and second cell devices 73 and 75.

A contact plug 71 can be formed in the via hole using any appropriate conductive material known in the art, for example, tungsten (W).

A metal interconnection to be electrically connected to the contact plug 71 can then be formed.

According to embodiments of the present invention, a passivation layer can be formed to inhibit the TEOS layer from reacting with a cleaning solution. Thus, no undercut can be formed at the TEOS layer, and a bit failure typically caused by a defective bridge between cell devices can be inhibited.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a flash memory device, comprising:
    forming a gate oxide layer on the semiconductor substrate;
    forming a first polysilicon layer on the gate oxide layer;
    forming an ONO layer on the first polysilicon layer;
    forming a second polysilicon layer on the ONO layer;
    patterning the gate oxide layer, the first polysilicon layer, the ONO layer, and the second polysilicon layer to form a gate region;
    forming a first tetraethyl orthosilicate (TEOS) layer sidewall spacer on both sides of the gate region;
    forming an oxide layer on the semiconductor substrate;
    forming a silicon nitride (SiN) layer on the semiconductor substrate; and
    patterning the oxide layer and the SiN layer to form a passivation layer and a SiN layer spacer, wherein the passivation layer is formed on the semiconductor substrate and under the SiN layer and on the side of the first TEOS layer;
    wherein the first TEOS layer is surrounded by the gate region, the SiN layer, the passivation layer, and teh semiconductor substrate.

2. The method according to claim 1, further comprising forming a source region and a drain region in the semiconductor substrate.

3. The method according to claim 1, further comprising:
    forming a second TEOS layer on the SiN layer; and
    patterning the second TEOS layer to form a second TEOS layer spacer.

4. The method according to claim 3, wherein the SiN layer and the second TEOS layer are formed on a sidewall of the first TEOS layer sidewall spacer.

5. The method according to claim 1, wherein forming the oxide layer comprises rapid thermal processing.

6. The method according to claim 5, wherein the rapid thermal processing is performed at a temperature of from about 800° C. to about 900° C.

7. The method according to claim 1, wherein forming the first TEOS layer sidewall spacer comprises reactive ion etching.

8. The method according to claim 1, wherein the passivation layer has a thickness of from about 10 Å to about 20 Å.

* * * * *

UNITED STATES PATENT AND TRADEMARK OFFICE
CERTIFICATE OF CORRECTION

PATENT NO. : 7,851,295 B2  Page 1 of 1
APPLICATION NO. : 11/930624
DATED : December 14, 2010
INVENTOR(S) : Jin Ha Park It is certified that error appears in the above-identified patent and that said Letters Patent is hereby corrected as shown below:

Title Page,
(73) Assignee, "Dongbu Hitech Co., Ltd." should read --Dongbu Hitek Co., Ltd.--.

Signed and Sealed this
Fifteenth Day of March, 2011

David J. Kappos
*Director of the United States Patent and Trademark Office*